(12) United States Patent
Ganser

(10) Patent No.: US 6,373,337 B1
(45) Date of Patent: Apr. 16, 2002

(54) DIFFERENTIAL AMPLIFIER

(75) Inventor: Siegfried Ganser, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/606,524

(22) Filed: Jun. 30, 2000

(30) Foreign Application Priority Data

Jun. 30, 1999 (DE) .......................... 199 30 171

(51) Int. Cl.[7] .................................. H03F 3/45

(52) U.S. Cl. .................. 330/252; 330/254; 330/255; 330/306

(58) Field of Search ................. 330/252, 254, 330/255, 302, 306

(56) References Cited

U.S. PATENT DOCUMENTS

| 5,352,987 A | | 10/1994 | Harvey ........................ 330/51 |
| 5,578,963 A | * | 11/1996 | Anderson .................... 330/252 |
| 5,900,781 A | | 5/1999 | Igarashi et al. ............. 330/254 |
| 6,043,710 A | * | 3/2000 | Smith et al. ................. 330/254 |
| 6,049,251 A | * | 4/2000 | Meyer ........................ 330/254 |

FOREIGN PATENT DOCUMENTS

JP 63292712 * 11/1988 .................. 330/254

* cited by examiner

*Primary Examiner*—Michael B Shingleton
(74) *Attorney, Agent, or Firm*—Morrison & Foerster LLP

(57) ABSTRACT

An integrated circuit (IC) differential amplifier is disclosed. The differential amplifier comprises two amplifier stages each containing a transistor amplifier stage connected to one of the inputs of a push-pull input ($RF_{in}$, $RFX_{in}$) and a cascode stage connected to one of the outputs of a push-pull output ($RF_{out}$, $RFX_{out}$), where the cascode stages can be switched by a changeover switch (DC gain switch).

16 Claims, 1 Drawing Sheet

DIFFERENTIAL AMPLIFIER

This application is based on German priority application 19930171.9, which is hereby incorporated in its entirety by reference.

TECHNICAL FIELD OF THE INVENTION

The present invention relates to a differential amplifier, and more particularly to a selective, switchable low-noise differential amplifier in the form of an integrated circuit (IC).

BACKGROUND OF THE INVENTION

The invention relates to a differential amplifier as an IC with a push-pull input, a push-pull output, two transistor amplifier stages and two cascode stages.

A similar differential amplifier is disclosed for example in "Halbleiter-Schaltungstechnik" [Semiconductor circuitry], page 392, Fig.4.74, Tietze/Schenk, $11^{th}$ Edition, Springer-Verlag. This known differential amplifier is a cascode differential amplifier.

In mobile radio, simple amplifier stages generally comprising low-noise individual transistors have been used heretofore in the prior art, where the necessary image frequency suppression is effected by a passive filter upstream of the amplifier and by a further passive filter upstream of the mixer that is connected downstream. The required frequency selection has thus taken place outside the amplifier, which is embodied in a discrete or integrated manner.

Although previous integrated known solutions for integrated circuits were constructed in a switchable and low-noise manner, they were nonetheless constructed in an unbalanced manner. The image frequency suppression was effected by a passive filter upstream of the LNA and by a passive filter upstream of the mixer, that is to say the frequency selection took place outside the IC.

Since mobile radio equipment, and hence the modules in this equipment, too, are subject to ever greater miniaturization, efforts are made to construct the modules in an embodiment which is as compact as possible.

U.S. Pat. No. 5,352,987 shows an analog multiplexer having a differential amplifier with two transistor amplifier stages and also respective cascode stages which are coupled thereto and to which a push-pull output is connected. A multi-emitter transistor is connected to the amplifier stages and serves to effect changeover between a plurality of such differential amplifier stages.

SUMMARY OF THE INVENTION

The object of the invention, therefore, is to provide a large-scale integrated amplifier which is suitable for amplifying a specific frequency with as little noise as possible.

Accordingly, the inventor proposes improving the known differential amplifier as an IC with a push-pull input ($RF_{in}$, $RFX_{in}$), a push-pull output ($RF_{out}$, $RFX_{out}$), two transistor amplifier stages and two cascode stages such that the cascode stages can be switched by a changeover switch (DC gain switch).

An advantageous refinement of the differential amplifier according to the invention provides for there to be a selection circuit in the IC, which selection circuit restricts the gain to a specific frequency.

The differential amplifier is advantageously constructed in such a way that the two cascode stages are constructed in a balanced manner.

The selection circuit of the resonant circuit may preferably have at least one capacitor and at least one coil.

The preferred design of the at least one coil is for it to be integrated as a planar loop of at least one interconnect in the IC.

A further preferred embodiment of the cascode differential amplifier according to the invention consists in the bias supply of the transistors of at least one amplifier stage having an integrated bandgap circuit and, if appropriate, an operational amplifier connected downstream. The bandgap circuit is a term for an integrated voltage supply which provides a reference voltage that is independent of the temperature and the supply voltage.

In addition or as an alternative, the bias supply of the transistors of at least one cascode stage may also comprise a corresponding, integrated bandgap circuit and, if appropriate, an operational amplifier connected downstream.

A further refinement of the differential amplifier according to the invention consists in negative feedback, preferably parallel negative feedback, with at least one resistor and/or at least one capacitance element in each case, being provided in at least one amplifier stage, preferably in both amplifier stages.

In addition, provision may be made for conducting away the signal at the push-pull output ($RF_{out}$, $RF_{out}$) via a capacitance element and a resistor.

The transistors of the differential amplifier may be configured either as npn or pnp bipolar transistors or as field effect transistors (FETs).

The circuit arrangement of the integrated module according to the invention for the first time provides an integrated, selective, gain-switchable and low-noise cascode differential amplifier, which may be used for example as a preamplifier of reception signals in mobile radio equipment and assists the image frequency suppression for constant input impedance and output impedance.

The features of the invention mentioned herein can be used not only in the combination specified in each instance but also in other combinations or by themselves, without departing from the scope of the invention.

BRIEF DESCRIPTION OF THE DRAWINGS

Embodiments of the invention will now be described by way of example with reference to the drawing in which.

DETAILED DESCRIPTION OF THE INVENTION

Figure 1:
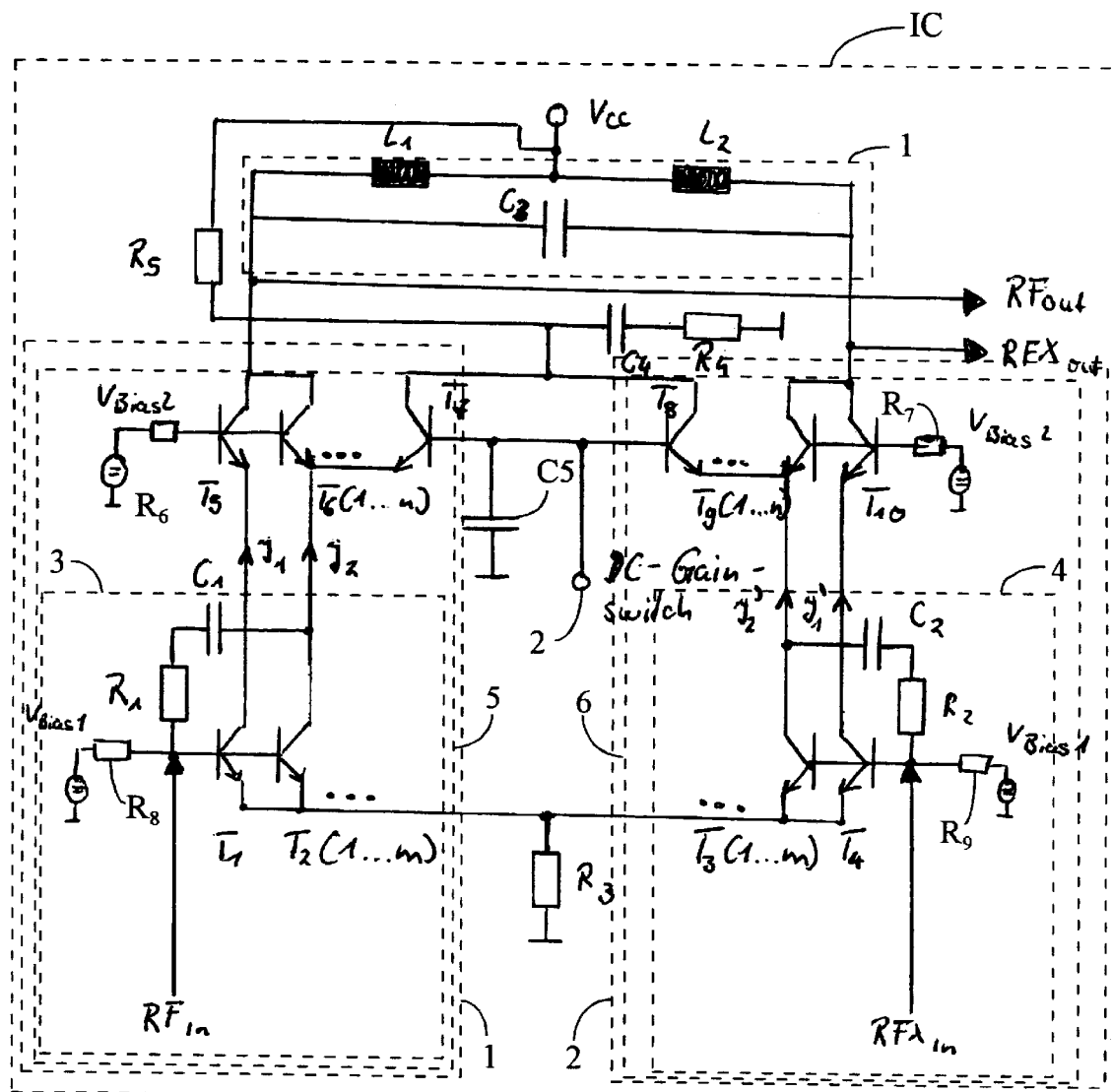
FIG. 1 shows an integrated circuit differential amplifier according to the invention.

FIG. 1 shows a preferred embodiment of a balanced circuit, according to the invention, of an electronic integrated circuit with a push-pull input $RF_{in}$ and $RFX_{in}$, a push-pull output $RF_{out}$ and $RFX_{out}$, two transistor amplifier stages 3 and 4, and two cascode stages 5, 6. The cascode stages 5 and 6 are embodied such that they can be changed over via a DC gain switch. Furthermore, according to the invention, a selection circuit 1 is provided in the IC, which selection circuit filters the amplified signal to a specific frequency band.

In this circuit, in detail, the transistors $T_1$ to $T_4$ form the amplifier stages 3 and 4, the resistor $R_3$ regulating the basic DC current of the circuit by means of the bias voltage—not illustrated for reasons of clarity—at the bases of $T_1$ to $T_4$.

The transistor $T_5$ forms the collector load of $T_1$ and the transistors $T_6$ (1 ... n) and $T_7$ form the collector load of the transistor $T_2$ (1 ... m). Similarly, the transistor $T_{10}$ is responsible for $T_4$ and the transistors $T_9$ (1 ... n) and $T_8$ are responsible for $T_3$ (1 ... m).

The collectors of the transistors $T_5$, $T_6$ (1 ... n) and $T_{10}$, $T_9$ (1 ... n) are connected to the supply voltage $V_{cc}$ via the selection circuit 1. The selection circuit 1 includes a resonant circuit with two coils $L_1$, $L_2$ and one capacitance element $C_3$. The collectors of the transistors $T_7$ and $T_8$ are connected to the supply voltage $V_{cc}$ via the resistor $R_5$.

The bias supply of the bases of the transistors $T_5$, $T_6$ (1 ... n) and $T_{10}$, $T_9$ (1 ... n) is likewise not illustrated, for the sake of better clarity, and is realized by means of an integrated bandgap circuit with an operational amplifier connected downstream, or just a bandgap circuit.

The base voltage of the transistors $T_7$ and $T_8$ can be varied via the three-conductor bus shown. If this base voltage is so small that the transistors $T_7$ and $T_8$ are in the off state, the entire RF signal is passed, having been amplified, to the output. If the base voltage at the transistors $T_7$ and $T_8$ becomes so large that the latter turn on, only part of the RF input signal is amplified and passed to the output through the transistors $T_5$ and $T_{10}$. In other words, an (n+1)-th of the RF input signal is passed to the output, where n corresponds to the number of parallel-connected transistors $T_6$ (1 ... n) or $T_9$ (1 ... n).

The capacitor $C_3$ forms a resonant circuit with $L_1$ and $L_2$, which resonant circuit, by way of its quality factor, preselects the amplified input signals arriving from the inputs $RF_{in}$ and $RFX_{in}$. The output signal is tapped off at the outputs $RF_{out}$ and $RFX_{out}$.

The series circuit formed by $R_1$ and $C_1$, and also $R_2$ and $C_2$, serves as parallel negative feedback for decreasing the input impedance and thus for increasing the linearity of the amplifier. It taps off the assigned signals in each case at the collector of the transistor $T_2$ (1 ... m) and at the collector of the transistor $T_3$ (1 ... m), respectively. As an alternative, purely resistive or purely capacitive negative feedback, or a tap at the collector of $T_1$ and $T_4$, respectively, is also possible without significant functional limitation.

Since the transistors $T_2$ (1 ... m) and $T_3$ (1 ... m), respectively, always carry current, a change in gain will not have the effect of influencing the negative feedback. An increase in the base voltage of the transistors $T_7$ and $T_8$ to an extent such that the latter attain the on state leads to the DC and AC signals being conducted away via the transistors $T_7$, $T_8$ and $R_5$ to $V_{cc}$.

In order to avoid reflections of the amplified and conducted-away AC signal in the circuit and fluctuations in the supply, provision is additionally made for the RF signal to be conducted away via the capacitance element $C_4$ and the resistor $R_4$ to ground. The number n specifies the number of transistors connected in parallel as $T_6$ and $T_9$, and the number m specifies the number of transistors connected in parallel as $T_2$ and $T_3$, which may vary between 1 and any desired number in accordance with the requirements made of the differential amplifier.

These parallel transistors define the current switching ratio $I_1/I_2$ and $I_1'/I_2'$, respectively, for the maximum and minimum gain. The maximum possible change in gain is calculated as $\Delta gain=20\log((N+1)/1)$. For n=9, therefore, $\Delta gain=20$ dB.

The quasi-parallel-connected transistors $T_1$ and $T_2$ (1 ... m) and respectively $T_3$ (1 ... m) and $T_4$ thus carry current in both gain states, in other words gain switching advanta-geously leads to no change in the input impedance. The output impedance is determined by the selection circuit 1, comprising a parallel resonant circuit formed by the capacitance element $C_3$ and the coils $L_1/L_2$, or by the quality factor thereof This quality factor is very low, therefore, a change in the gain also brings about no significant change in the output impedance.

The amplifier stages have respective current paths connected in parallel. In the amplifier stage shown on the left in the figure, the current paths are formed by the transistors $T_5$, $T_1$ and $T_6$, $T_2$, whose collector-emitter paths are connected in series. The transistors $T_1$, $T_2$ and $T_5$, $T_6$ are each driven in parallel, owing to the fact that their base terminals are connected to one another. The cascode stage of one of the current paths, namely the cascode stage comprising the transistor $T_6$, is designed as a current switch and comprises two emitter-coupled transistors $T_6$, $T_7$. The amplifier stage shown on the right in FIG. 1 has a balanced structure with respect thereto. The cascode stages of the two amplifier branches are coupled by the changeover switch in such a way that the transistors $T_7$, $T_8$ are connected to one another by their bases and collectors, the control signal DC-Gain-Switch being applied to the coupled base terminals.

The capacitance element $C_5$, which is arranged between the two transistors $T_7$ and $T_8$, in this case serves to block interfering frequencies. The resistors $R_6$ to $R_9$ serve for decoupling the amplifier from the applied bias voltages.

Overall, the circuit described above achieves a significant miniaturization of a selective, switchable and low-noise differential amplifier, preferably for the preamplification of reception signals in mobile radio, which acts to assist the suppression of image frequencies and has a constant input impedance and output impedance.

The German Application No. 19930171.9 is relied upon and hereby incorporated by reference in its entirety.

Various preferred embodiments of the invention have now been described. While these embodiments have been set forth by way of example, various other embodiments and modifications will be apparent to those skilled in the art. Accordingly, it should be understood that the invention is not limited to such embodiments, but encompasses all that which is described in the following claims.

What is claimed is:

1. An integrated circuit (IC) differential amplifier with a push-pull input which is connected to a transistor amplifier stage and a push-pull output which is connected to a cascode stage wherein the cascode stage is coupled to another cascode stage via a changeover switch and the transistor amplifier stage and the cascode stage comprise parallel-connected paths containing transistors which can be driven in parallel.

2. The differential amplifier as claimed in claim 1, wherein in the cascode stages are constructed in a balanced manner.

3. The differential amplifier as claimed in claim 1, wherein a selection circuit is provided on the IC to restrict gain to a specific frequency.

4. The differential amplifier as claimed in claim 3, wherein the selection circuit has a resonant circuit with at least one capacitor and at least one coil.

5. The differential amplifier as claimed in claim 4, wherein the at least one coil is integrated as a planar loop of at least one interconnect in the IC.

6. The differential amplifier as claimed in claim 1, wherein a bias supply of at least one transistor of at least one amplifier stage has an integrated bandgap circuit.

7. The differential amplifier as claimed in claim 1, wherein a bias supply of at least one transistor of at least one cascode stage has an integrated bandgap circuit.

8. The differential amplifier as claimed in claim 1, wherein negative feedback with at least one resistor and/or one capacitance element is provided in at least one amplifier stage.

9. The differential amplifier as claimed in claim 1, wherein a signal at the push-pull output is conducted away via a capacitance element and a resistor.

10. The differential amplifier as claimed in claim 1, wherein at least one transistor of the differential amplifier is designed as an npn transistor.

11. The differential amplifier as claimed in claim 1, wherein at least one transistor of the differential amplifier is designed as a pnp transistor.

12. The differential amplifier as claimed in claim 1, wherein at least one transistor of the differential amplifier is designed as a FET.

13. The differential amplifier as claimed in claim 1, wherein the changeover switch comprises at least two emitter-coupled transistors and one of the transistors of one of the cascode stages and one of the transistors of another of the cascode stages are coupled to one another by their collectors and bases.

14. An integrated circuit (IC) differential amplifier comprising two amplifier stages, wherein each amplifier stage comprises a transistor amplifier stage connected to one input of a push-pull input and a cascode stage connected to one output of a push-pull output, each cascode stage being connected to the corresponding transistor amplifier stage, wherein the cascode stages are coupled via a changeover switch and each amplifier stage comprises parallel-connected paths comprising a transistor amplifier stage and a cascode stage, wherein the parallel-connected paths contain transistors which can be driven in parallel.

15. The differential amplifier according claim 14, further comprising a selection circuit within the IC which restricts input signal gain to a specific frequency.

16. The differential amplifier according to claim 14, further comprising negative feedback circuitry in at least one transistor amplifier stage.

* * * * *